(12) United States Patent
Kafati et al.

(10) Patent No.: US 9,417,275 B2
(45) Date of Patent: Aug. 16, 2016

(54) CABLE MEASURING DEVICE AND METHOD

(71) Applicants: Nadim Kafati, Hayward, CA (US); Rafael Herrera, Pleasanton, CA (US)

(72) Inventors: Nadim Kafati, Hayward, CA (US); Rafael Herrera, Pleasanton, CA (US)

(73) Assignee: Beta Lasermike, Dayton, OH (US)

( * ) Notice: Subject to any disclaimer, the term of this patent is extended or adjusted under 35 U.S.C. 154(b) by 240 days.

(21) Appl. No.: 14/221,176

(22) Filed: Mar. 20, 2014

(65) Prior Publication Data

US 2015/0268287 A1     Sep. 24, 2015

(51) Int. Cl.
*G01R 27/32* (2006.01)
*G01R 31/02* (2006.01)
*H04B 3/46* (2015.01)
*H04L 12/26* (2006.01)

(52) U.S. Cl.
CPC .............. *G01R 31/021* (2013.01); *G01R 27/32* (2013.01); *H04B 3/46* (2013.01); *H04L 12/2697* (2013.01)

(58) Field of Classification Search
CPC ....... G01R 31/021; G01R 27/32; G01R 27/28
USPC ................. 324/529, 532–535, 539–544; 375/224–228
See application file for complete search history.

(56) References Cited

U.S. PATENT DOCUMENTS

| | | | | |
|---|---|---|---|---|
| 5,821,760 A | * | 10/1998 | Koeman | H04B 3/46 324/539 |
| 6,259,256 B1 | * | 7/2001 | Walling | G01R 31/021 324/537 |
| 2002/0017393 A1 | * | 2/2002 | Hanna-Myrick | H01B 11/125 174/113 R |

* cited by examiner

*Primary Examiner* — Arleen M Vazquez
*Assistant Examiner* — Robert P Alejnikov, Jr.
(74) *Attorney, Agent, or Firm* — R. William Graham

(57) ABSTRACT

A cable measuring device for measuring a cable of a predetermined LAN cable category wherein the cable has at least one twisted conductive pair and jacket covering the same includes a computer based device which removes tail up effect on the impedance/return loss measurement and which addresses the effects of jacket removed on the reflection test results of LAN cables.

2 Claims, 7 Drawing Sheets

L - total length of cable
Ln - length of jacket removed from near end
Lf - length of jacket removed from far end
Lr - length of cable for reflection test report
+length of cable - length of jacket removed (near or far end)

L - total length of cable
Ln - length of jacket removed from near end
Lf - length of jacket removed from far end
Lr - length of cable for reflection test report
Lr - length of cable - length of jacket removed (near or far end)
+length of cable - length of jacket removed (near or far end)

CABLE MEASURING DEVICE AND METHOD

FIELD OF INVENTION

The invention relates to the field of cable measurement. More particularly, the instant invention relates to cable measuring device and method wherein accurate reflection measurements of (jacketed) twisted pair cables at frequencies above a predetermined MHz.

PRIOR ART

A computer network or data network is a telecommunications network that allows computers to exchange data. The most common type of computer network is the Local Area Network or LAN. LANs are made up computer interconnected in a relatively small geographical area.

Twisted pair cables are widely used for interconnecting computers in LANs. LAN users and applications are constantly requiring faster data transfer speeds. Technological improvements in computers, interconnecting electronics cable and connectors allow for faster data transfer speeds.

The classification of twisted pair cables for LAN applications is based on the data rate that they can carry. The term category is used to classify the LAN cables according to the data rate that they can carry. The main categories that are presently used are: Category 3, Category 5E, Category 6, Category 6A, Category 7 and Category 7A. The higher the category number the higher the data speed than can be carried over the LAN cables. Domestic and international standardization bodies are presently working on Category 8 cables.

There are standards organizations which develop specifications requirements for the electrical transmission parameters of these category cables. These specifications require LAN cables to be tested at different frequency ranges as follows:

Category 3 1 MHz to 16 MHz
Category 5E 1 MHz to 100 MHz
Category 6 1 MHz to 250 MHz
Category 6A 1 MHz to 500 MHz
Category 7 3 MHz to 600 MHz
Category 7A 3 MHz to 1000 MHz
Category 8 1 MHz to 2000 MHz Different specification limit values are given for each transmission parameter at different test frequencies. For a cable to be compliant with a given category it has to pass all the test parameter specification limits at the different frequencies.

Testing the transmission parameters of LAN cables with automatic test systems provide:
 fixturing for cable connection
 software to control the test instruments used for testing
 acquire test data for comparison against specification limits
 provide test reports
 data storage of the data acquired.

It is well known that the effect of the length of jacket removed on the reflection measurements test results may be minimized by modifying the connecting fixtures. As the length of jacket is removed (shortens), the frequency at which the tailing up/down effect is seen increases. It is necessary to remove some of the cable jacket to perform the test of the cable and thus there will always remain a tailing up/down effect due to the length of jacket removed. This may be very confusing to the cable manufacturers since they may reject good cable or pass bad cable due to failures on the reflection test results. The reproducibility of the reflection test results is also affected since the end of cable prepared by different individuals provides different reflection test results.

It is therefore desirable to achieve repeatability and reproducibility (R&R) of the test results. The connection of the cable under test (CUT) to the test equipment is theoretically not to be a factor that alters the cable performance. However, to connect the CUT to the test system, the cable ends need to be prepared. This cable preparation for connection requires removing a length of cable jacket to provide access to the individual pairs. See FIG. 1.

LAN cables transmission parameters are divided in two major groups: through measurements (from end to end) and reflection measurements (same end).

Through parameters, S21 and S12 include:
 insertion loss
 propagation delay
 crosstalk Reflection parameters, S11 and S22 include:
 input impedance
 return loss.

The amount of cable jacket removed affects the results of the reflection measurements. Specifically, the connection hardware and cable ends result in a short section of the tested cable with distinctly different impedance at each end of the cable. This impedance mismatch causes variations in the measurement that are not present in the cable itself.

If the short length of mismatch is a bit higher than the cable impedance, then the impedance trace tends to tail up with increasing frequency. If lower, then the impedance trace tends to tail down. As the test frequency increases the length of jacket removed effect becomes more notorious. The effect of jacket removal manifests as a tailing (up or down) of the input impedance test results. See FIG. 2.

The input impedance results shown on FIG. 2 input impedance results are evenly distributed around 100 Ohms in the frequency range from 1 MHz to 250 MHz. After 250 MHz this even distribution starts showing more data below 100 Ohms than above 100 Ohms. The input impedance is showing a tail-down effect. Because of the combined effects of the cable, cable preparation, and test connection fixtures. This tail-down effect is due to the cable itself or to the length of jacket removed for cable connection to the test system. Whether the impedance trace tends to tail up or down, the reflection coefficient is increased compared to that of the cable itself, causing an error in measuring inherent cable performance.

FIG. 3 shows the return loss test data of the same cable using the same connection. No evaluation of the return loss results to the length of jacket removed can be made yet.

Prior Art attempted to remove the above described variations using various techniques described below.

A. Fixture Design

A commonly used technique is to use highly engineered fixtures to minimize impedance discontinuities in the signal path. However, as test frequencies increase, this becomes more difficult. Constraints such as connector size, managing crosstalk performance in multi-pair fixtures and other physical design constraints limit the ability to maintain impedance control in the fixtures. Also the physical limitations of connecting to the pair under test also places limits on the ability to control impedance discontinuities.

B. Single Pair Tests

A single pair is connected to integrated circuit type sockets. This technique minimizes the amount of jacket removed providing accurate results at higher frequencies than other method. However with this technique is not possible to obtain a reasonable reproducibility. Lack of good reproducibility makes the test system unsuitable for gauge R&R evaluation.

C. Using Connector Plugs to Terminate Pairs

A minimum length of jacket removal is required for installing the connectors. These additional connectors also increase the reflection coefficient between the test fixture and the cable under test. Because each time a cable is terminated with a connector, there are variations in the way the conductors are arranged. Measurement reproducibility is affected by the inherent mechanical limitations.

D. Gating Using the Network Analyzer (Time-Domain Reflectometer—TDR)

Gating within the network analyzer is a technique known to improve measurements due to impedance discontinuities. This technique 'eliminates' portions of the signal in the time domain. The resulting measured signal can be converted to frequency domain by using Inverse fast Fourier transform (IFFT) technique. However, a problem with this technique can be 'masking' which is a term used to describe the inaccuracies that can occur when reflected power is 'removed' from the measurement. This can alter the calculated transmitted power, causing errors in parameters such as insertion loss or crosstalk.

SUMMARY OF THE INVENTION

It is an object to improve cable measurement.

It is another object to improve devices for measuring cables.

It is a further object to improve repeatability and reproducibility in measuring characteristics of cable.

A solution is needed to guarantee that LAN cable reflection tests are not dependent on the length of jacket removed and the individual preparing the cable for connection to the test system.

Accordingly, one aspect of the instant invention is directed to a cable measuring device for measuring a cable of a predetermined LAN cable category wherein the cable has at least one twisted conductive pair and jacket covering the same. The device includes a computer based device having hardware and software, a first cable connecting device for connecting a near end of a cable, a second cable connecting device for connecting a far end of the cable, a first balun transformer device operably connected to the first cable connecting device, a second balun transformer device operably connected to the second cable connecting device, an automatic switching device operably interconnecting each of the balun transformer devices and the computer based device, and a vector network analyzer operably connected to the computer based device wherein the computer software is equipped to receive a signal indicative of a length of jacket removed from the cable, to perform a reflection test in a frequency range required by a predetermined LAN cable category associated with the cable using the vector network analyzer, to perform data conversion, to apply inverse fast Fourier transform to eliminate a length of a jacket removed from measurement of the cable, to apply fast Fourier transform to convert data back to the frequency domain and to provide and output signal indicative of a true LAN cable reflection.

A method of measuring reflection of a cable of a predetermined LAN cable category is provided wherein the cable has at least one twisted conductive pair and jacket covering the same. The method includes providing a computer based device having hardware and software, providing a first cable connecting device for connecting a near end of a cable and a second cable connecting device for connecting a far end of the cable, providing a first balun transformer device operably connected to the first cable connecting device and a second balun transformer device operably connected to the second cable connecting device, providing an automatic switching device operably interconnecting each of the balun transformer devices and the computer based device, providing a vector network analyzer operably connected to the computer based device, wherein the computer software is equipped to receive a signal indicative of a length of jacket removed from the cable, to perform a reflection test in a frequency range required by a predetermined LAN cable category associated with the cable using the vector network analyzer, to perform data conversion, to apply inverse fast Fourier transform to eliminate a length of a jacket removed from measurement of the cable, to apply fast Fourier transform to convert data back to the frequency domain and to provide and output signal indicative of a true LAN cable reflection and providing a cable having a portion of its cable jacket removed from a near end and a portion of cable jacket removed from a far end of the cable, connecting the near end of the cable to the first cable connecting device, connecting the far end of the cable to the second cable connecting device, initiating the computer based device to receive a signal indicative of a length of jacket removed from the cable, to perform reflection test in the frequency range required by the predetermined LAN cable category associated with the cable using the vector network analyzer, to perform data conversion, to apply inverse fast Fourier transform to eliminate a length of the jacket removed from measurement of the cable, to apply fast Fourier transform to convert data back to the frequency domain and and provide and output signal indicative of a true LAN cable reflection.

DETAILED DESCRIPTION OF THE PREFERRED EMBODIMENT

Figure 4:
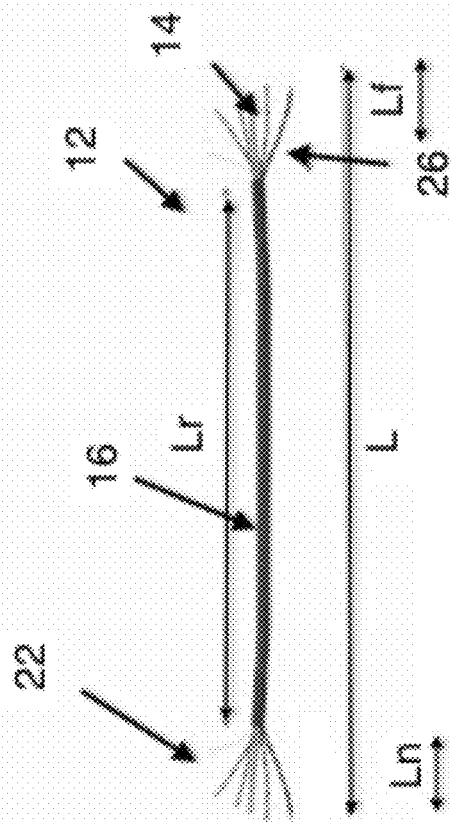
FIG. 4 shows a pictorial description on how a LAN cable is prepared for connection to the device of the instant invention.

Referring now to the drawings, the cable measuring device of the instant invention is generally referred to by the number 10. The cable measuring device 10 is for measuring a cable 12 of a predetermined LAN cable category wherein the cable 12 has one or more twisted conductive pair 14 and jacket 16 covering the same. FIG. 4 shows a pictorial description on how the LAN cable is prepared for connection to the test system.

The cable measuring device 10 includes a computer based device 18 having hardware and software which is more fully explained hereinafter. A first cable connecting device 20 for connecting a near end 22 of cable 12. A second cable connecting device 24 is for connecting a far end 26 of cable 12.

A first balun transformer device 28 is operably connected to the first cable connecting device 20 and a second balun transformer device 30 is operably connected to the second cable connecting device 24. An automatic switching device 32 operably interconnects each of the balun transformer devices 28 and 30 and the computer based device 18. A vector network analyzer 34 operably connects to the computer based device 18.

The computer software in the device 10 is to receive an input signal indicating a length of jacket 16 removed (Ln and Lf) from the cable 12. The software performs a reflection test in a frequency range required by a predetermined LAN cable category associated with the cable 12 using the vector network analyzer 34. The software performs data conversion, applies an inverse fast Fourier transform to eliminate a length (Ln and Lf) of a jacket 16 removed from measurement of the cable 12, and applies fast Fourier transform to convert data back to the frequency domain thereby providing and output signal indicative of a true LAN cable reflection.

FIG. 4 shows the total length (usually 100 meters) of cable 12 that requires transmission parameters testing. A length of jacket 16 is removed from the near end (Ln) and the far end (Lf) of the cable 12 to expose the twisted pairs 14 for connection to the test device. This cable preparation is fine for end to end testing (through) but the length of jacket removed (Ln and Lf) affects the reflection measurements at frequencies above 250 MHz causing the tail up/down effect mentioned herein.

Figure 5:
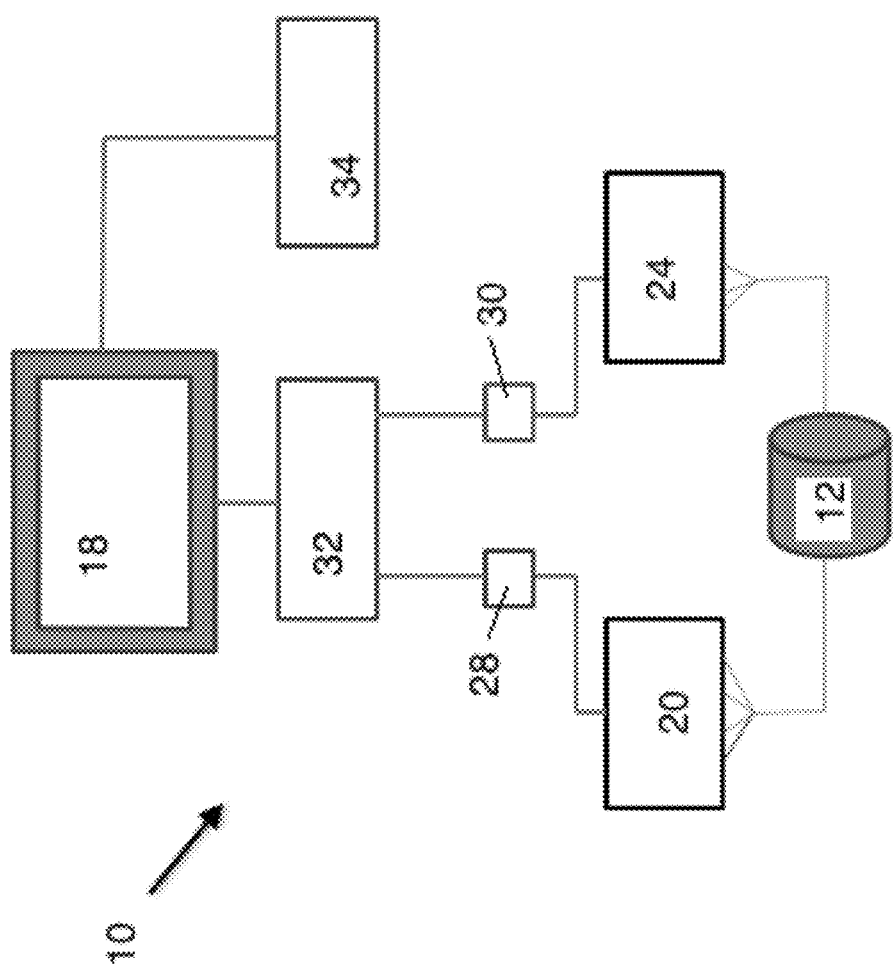
FIG. 5 shows a schematic block diagram of the instant invention.

Accordingly, FIG. 5 depicts a block diagram of instant invention's solution for LAN cable electrical parameters automatic measurements. This solution applies to measurements performed using a balance to unbalance (balun) transformer 28, 30. The balun 28, 30 interfaces coaxial output of the vector network analyzer 34 to the balanced twisted pair 14.

The instant invention employs computer based device 18 which has application software and which provides an automatic test system having an algorithm that mathematically removes the tail up/down effect of the reflection measurements. In addition to the software removing the tail up/down effects the instant invention removes dependence of a specific individual for cable preparation and provides excellent reproducibility of the reflection test results.

An exemplary technique employed by instant invention (other techniques are also contemplated) is based on a process that performs an Inverse Fast Fourier Transform (IFFT) on the data obtained from the vector network analyzer during reflection measurements.

The steps required to remove the tail up/down effects using IFFT are achieved the invention which employs a method of measuring reflection of a cable 12 of a predetermined LAN cable category is provided wherein the cable 14 has at least one twisted conductive pair 14 and jacket 16 covering the same. The method includes providing a computer based device 18 having hardware and software, providing a first cable connecting device 20 for connecting a near end 22 of a cable 12 and a second cable connecting device 24 for connecting a far end 26 of the cable 12, providing a first balun transformer device 28 operably connected to the first cable connecting device 20 and a second balun transformer device 30 operably connected to the second cable connecting device 24, providing an automatic switching device 32 operably interconnecting each of the balun transformer devices 28 and 30 and the computer based device 18, providing a vector network analyzer 34 operably connected to the computer based device 18. The computer software is to receive a signal, indicative of a length of jacket removed (Ln and Lf) from the cable 12 and to perform a reflection test in a frequency range required by a predetermined LAN cable category associated with the cable 12 using the vector network analyzer 34. The software is to perform data conversion, to apply inverse fast Fourier transform to eliminate a length of a jacket removed (Ln and Lf) from measurement of the cable 12, to apply fast Fourier transform to convert data back to the frequency domain and to provide and output signal indicative of a true LAN cable reflection. The method further includes providing cable 12 having a portion of its cable jacket removed (Ln) from a near end 22 and a portion of cable jacket removed (Lf) from a far end 26 of the cable 12. The method further includes connecting the near end 22 of the cable 12 to the first cable connecting device 20, connecting the far end 26 of the cable 12 to the second cable connecting device 24. The final steps employed are initiating the computer based device 18 to receive a signal indicative of a length of jacket removed (Ln and Lf) from the cable 12, to perform a reflection test in the frequency range required by the predetermined LAN cable category associated with the cable 12 using the vector network analyzer 34, to perform data conversion, to apply inverse fast Fourier transform to eliminate a length of the jacket removed (Ln and Lf) from measurement of the cable 12, to apply fast Fourier transform to convert data back to the frequency domain and provide and output signal indicative of a true LAN cable reflection.

It will be understood that the embodiment of the invention includes a computer based device having hardware and software, a first cable connecting device for connecting a near end of a cable, a second cable connecting device for connecting a far end of the cable, a first balun transformer device operably connected to the first cable connecting device, a second balun transformer device operably connected to the second cable connecting device, an automatic switching device operably interconnecting each of the balun transformer to the vector network analyzer. The vector network analyzer and the automatic switching device are connected to a computer that runs the application software that controls the vector network analyzer and the switching device in addition to performing all the required mathematical processes, i.e., inverse fast Fourier transform. The application software also generates the test reports of the cable under test. The actual length of the jacket removed from the cable as depicted in FIG. 4 is understood by those skilled in the art to be manually entered in the software application graphical user interface. Once the cable information is entered in the graphical user interface the test starts. The application program commands the vector network analyzer to perform a reflection test in a frequency range required by a predetermined LAN cable category. With the frequency domain reflection data acquired by the vector network analyzer, the application program performs an inverse fast Fourier transform (IFFT) to convert the frequency domain data to the time domain data. In the time domain the length of jacket removed and the signal velocity of propagation are used to modify the time data (speed=velocity/time). The modified time domain data is converted back to the frequency domain using fast Fourier transform (FFT). This frequency domain data has the correction required to remove the impedance and return loss tailing up/down effects that are due to the length of jacket originally removed from the cable. This final result provides the cable under test true impedance and return loss results. The final result prevents the rejection of a good cable that due to the length of jacket removed may indicate to be faulty if this invention is not used.

It is also known that the frequency range for Category cables has continually increased, and is currently at 500 MHz for Category 6a, and the 1 GHz region for Category 7/7a. Upcoming cable specifications are now underway to extend this range to 2 GHz.

There are a wide range of cable types with balanced pair configurations that far exceed 2 GHz in operation. The instant invention employs a technique which is useful for any balanced pair transmission line, whether a cable or other device where termination effects cause errors in measurement accuracy.

It is important to maintain the accuracy of the calculations such that calculation errors do not significantly contribute to the test result. It has been found there are requirements and relationships for factors such as the maximum frequency of the test, the number of data points taken, FFT matrix size, and desired fixture/cable length to eliminate.

Corrected Results

Figure 6:
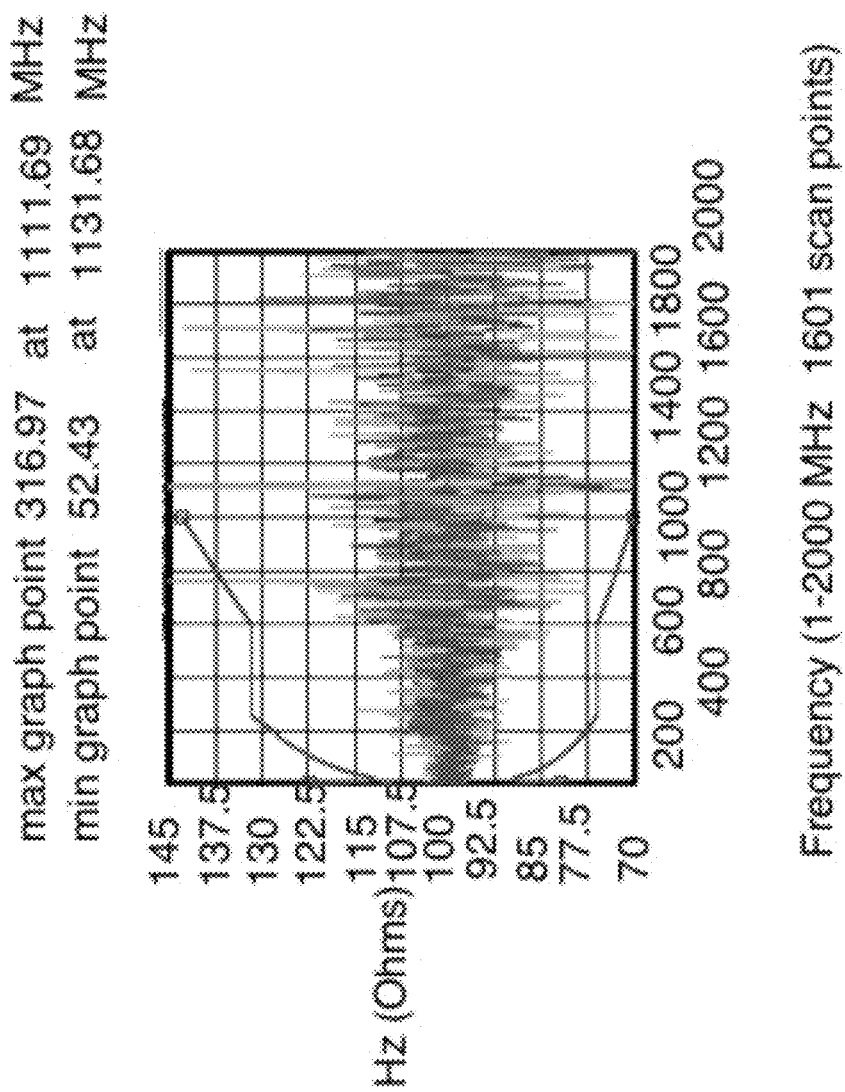
FIG. 6 shows input impedance test results for the cable using the invention.
Figure 7:
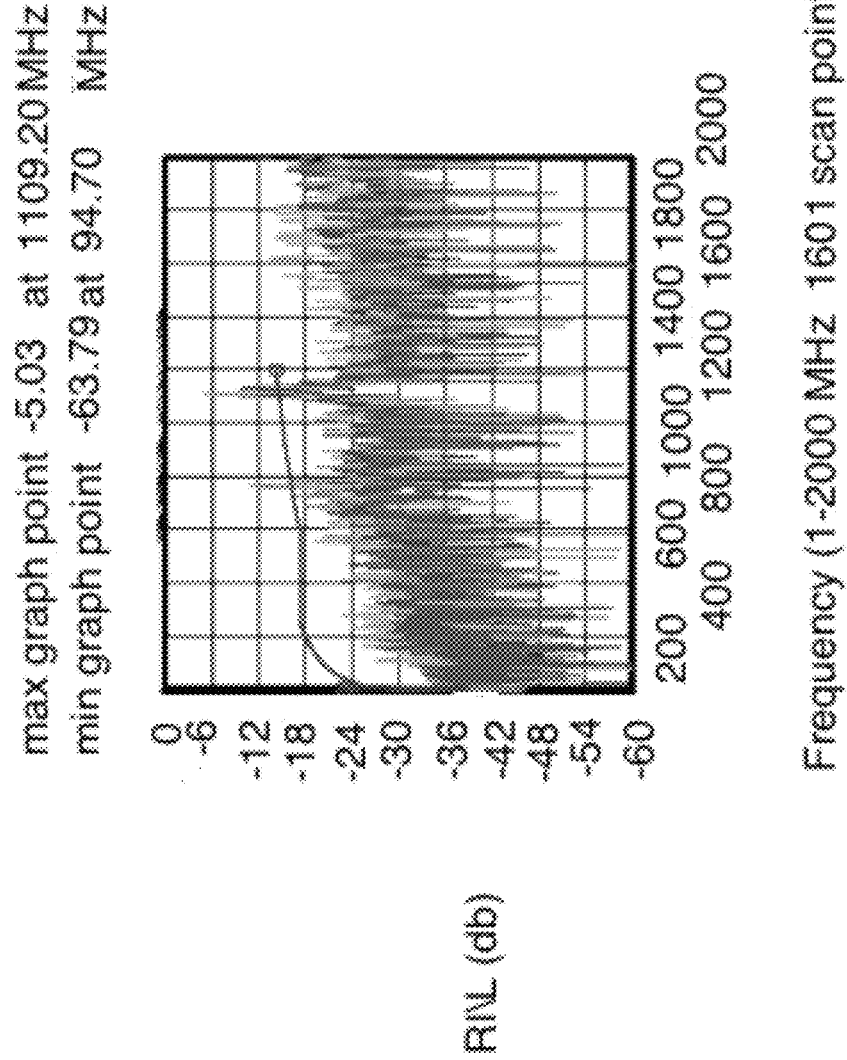
FIG. 7 shows return loss test data of the same cable using the same connection using the invention.

FIGS. 6 and 7 show the input impedance and return loss test results after the tailing up/down effect is removed using the instant invention described above. These results are obtained from the data acquired for FIGS. 2 and 3.

Figure 1:
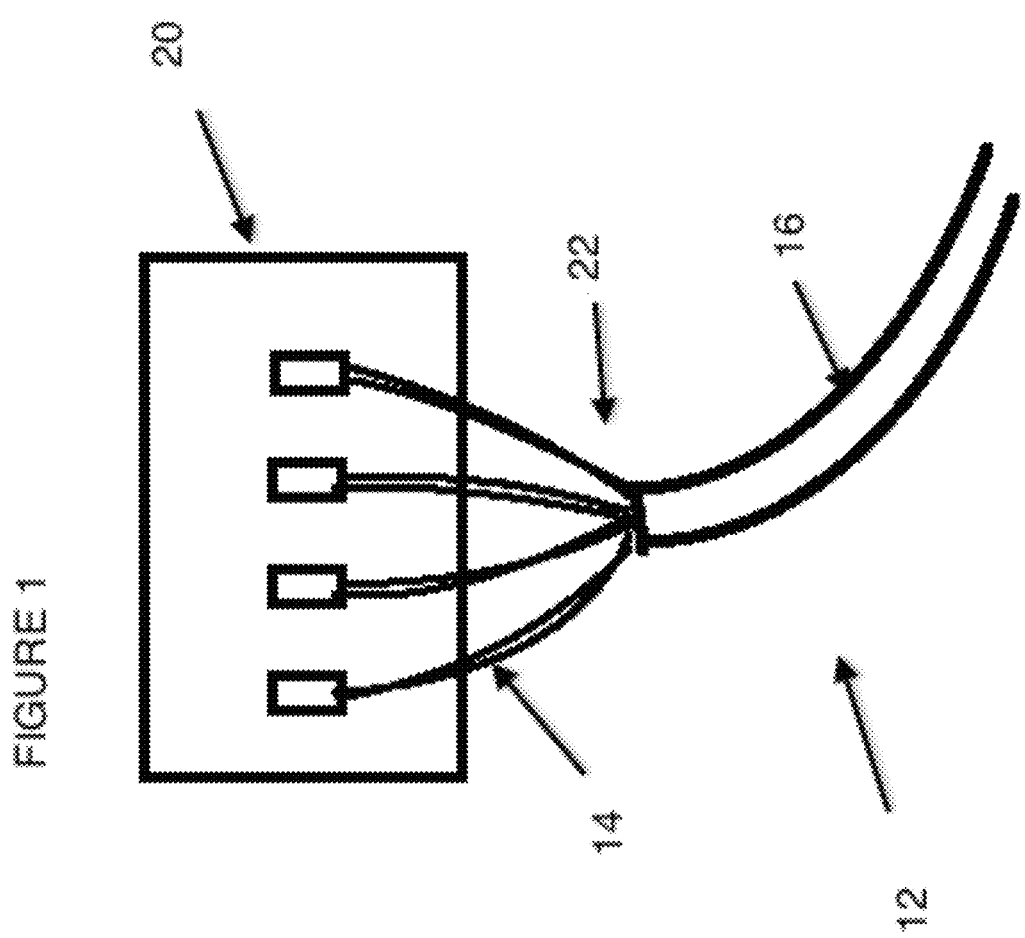
FIG. 1 depicts a connecting fixture.
Figure 2:
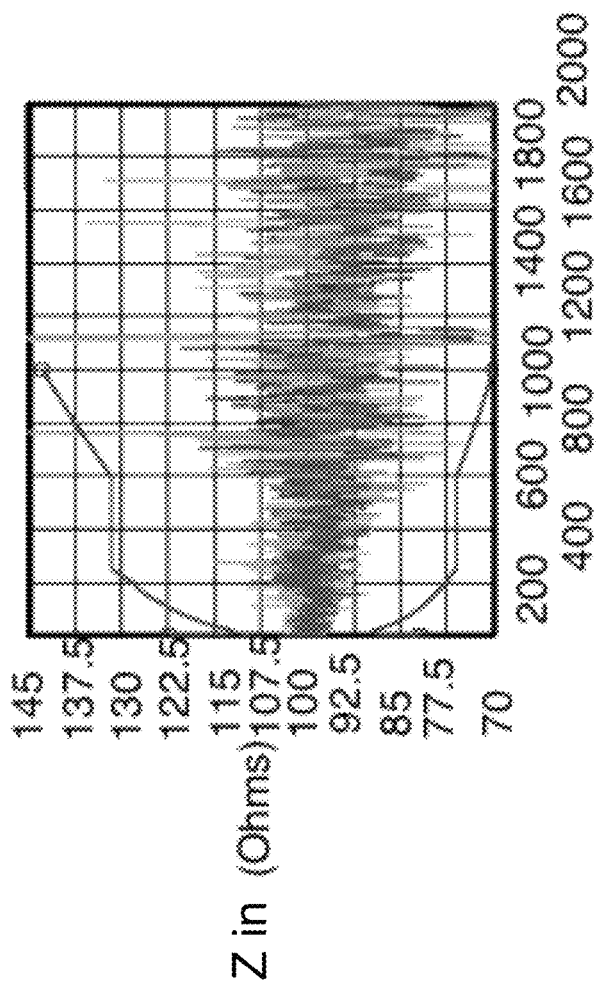
FIG. 2 shows an example of input impedance test results for a cable.
Figure 3:
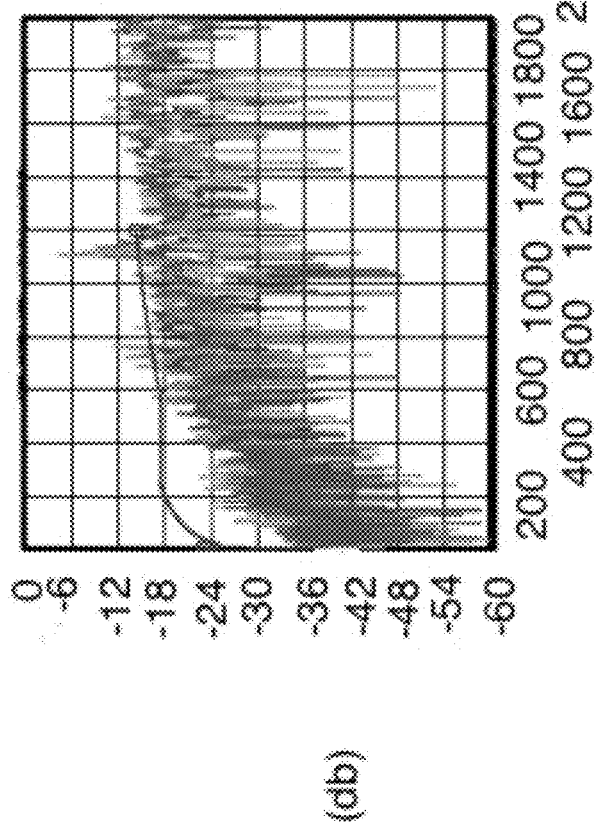
FIG. 3 shows the return loss test data of the same cable using the same connection.

A comparison between FIG. 2 and FIG. 6 shows that after the use of the instant invention described herein the tail down effect on the input impedance is removed. A similar result may be seen when FIG. 3 and FIG. 7 are compared. The return loss results improve after 250 MHz. The results on FIGS. 6 and 7 are the true input impedance and return loss results of the cable under test.

By employing the instant invention, there is provided a device to remove this tail up effect on the impedance/return loss measurement which addresses the effects of jacket removed on the reflection test results of LAN cables, removes the dependence of a specific individual for cable preparation, and provides excellent reproducibility of the reflection test results.

Benefits achieved by the instant invention are as follows:

1) A measurement process that allows accurate data acquisition for proper application of IFFT techniques to remove effect of jacket removal.
2) A calculation method to remove reflection effects at the source end of a measured transmission line using FFT and IFFT.
3) Where the amount of transmission line length to remove from the measurement is about 0.1 to 1% of the entire measured transmission line.
4) Where the measurement errors induced by the FFT processing is about 1% or less.
5) Where impedance changes of at least 20% can be eliminated with no more than 2% error in the inherent cable measurement.
6) Where the number of points required for the IFFT size is automatically selected by the application program.
7) Where the signal processing techniques are suitable for frequency ranges of 250 MHz and above.
8) Automatic testing of twisted pair cables wherein the device controls the data acquisition process from a vector network analyzer to apply digital signal processing techniques to the implementation of IFFT for accurate reflection measurements.
9) Automatic testing of twisted pair cables that performs an IFFT function, and processes the data in the time domain and converts back to the frequency domain for data reporting.
10) Automatic testing of twisted pair cables that performs the required calculations for getting time domain information from acquired frequency data using digital signal processing techniques.

Although various embodiments of the invention have been shown and described, they are not meant to be limiting. Those of skill in the art may recognize various modifications to these embodiments, which modifications are meant to be covered by the spirit and scope of the appended claims.

What is claimed is:

1. A cable measuring device for measuring a cable of a predetermined LAN cable category wherein the cable has at least one twisted conductive pair and a jacket covering said pair, the jacket being partially removed from the cable, which includes:

a first cable connecting device for connecting a near end of a cable; a second cable connecting device for connecting a far end of the cable; a first balun transformer device operably connected to said first cable connecting device;

a second balun transformer device operably connected to said second cable connecting device;

an automatic switching device operably connected to each of said balun transformer devices;

a vector network analyzer; and a computer based device operably interconnecting said vector network analyzer and said automatic switching device and having hardware and software, wherein said software receives a signal indicative of a length of said jacket that has been removed from the cable to facilitate connection of said cable to said connecting devices, wherein said computer based device is configured to:
perform a reflection test in a frequency range required by a predetermined LAN cable category associated with the cable using said vector network analyzer,
perform data conversion,
apply an inverse fast Fourier transform to eliminate data corresponding to the length of said jacket removed from the cable,
apply a fast Fourier transform to convert data back to the frequency domain, and
output a signal indicative of a true LAN cable reflection without distortion caused by said length of said jacket removed from the cable.

2. A method of measuring reflection of a cable of a predetermined LAN cable category wherein the cable has at least one twisted conductive pair and a jacket covering said pair, the jacket being partially removed from the cable, wherein the method includes the steps of:

a) providing a first cable connecting device for connecting a near end of a cable and a second cable connecting device for connecting a far end of the cable;

b) providing a first balun transformer device operably connected to the first cable connecting device and a second balun transformer device operably connected to the second cable connecting device;

c) providing an automatic switching device operably connected to each of the balun transformer devices;

d) providing a vector network analyzer;

e) providing a computer based device having hardware and software, said computer based device operably interconnecting said vector analyzer and said automatic switching device, wherein said software:
receives a signal indicative of a length of said jacket removed from said cable to facilitate connection to said connecting devices,
perform a reflection test in a frequency range required by a predetermined LAN cable category associated with the cable using the vector network analyzer,
perform data conversion,
apply an inverse fast Fourier transform to eliminate data corresponding to the length of said jacket removed from the cable,
apply a fast Fourier transform to convert data back to the frequency domain, and output a signal indicative of a true LAN cable reflection without distortion caused by said length of said jacket removed from the cable;

f) providing a cable having a portion of its cable jacket removed from a near end and a portion of cable jacket removed from a far end of the cable;

g) connecting the near end of the cable to the first cable connecting device;

h) connecting the far end of the cable to the second cable connecting device; and i) initiating the computer based device to receive a signal indicative of a length of jacket removed from the cable, to perform a reflection test in the frequency range required by the predetermined LAN cable category associated with the cable using the vector network analyzer, to perform data conversion, to apply an inverse fast Fourier transform to eliminate data corresponding to the length of the jacket removed from measurement of the cable, to apply a fast Fourier transform to convert data back to the frequency domain, and to output a signal indicative of a true LAN cable reflection without distortion caused by said length of said jacket removed from the cable.

\* \* \* \* \*